United States Patent
Huang et al.

(10) Patent No.: US 9,722,109 B2
(45) Date of Patent: Aug. 1, 2017

(54) IMAGE SENSOR DEVICE AND METHOD

(71) Applicant: Taiwan Semiconductor Manufacturing Company, Ltd., Hsin-Chu (TW)

(72) Inventors: Kuo-Chin Huang, Yilan (TW); Tzu-Jui Wang, Fengshan (TW); Szu-Ying Chen, Toufen Township (TW); Dun-Nian Yaung, Taipei (TW); Jen-Cheng Liu, Hsin-Chu (TW); Bruce C. S. Chou, Hsin-Chu (TW); Jung-Kuo Tu, Hsin-Chu (TW); Cheng-Chieh Hsieh, Yongkang District (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/131,207

(22) Filed: Apr. 18, 2016

(65) Prior Publication Data

US 2016/0233347 A1   Aug. 11, 2016

Related U.S. Application Data

(63) Continuation of application No. 14/880,720, filed on Oct. 12, 2015, now Pat. No. 9,318,528, which is a continuation of application No. 13/929,661, filed on Jun. 27, 2013, now Pat. No. 9,159,852.

(60) Provisional application No. 61/791,989, filed on Mar. 15, 2013.

(51) Int. Cl.
*H01L 31/062*   (2012.01)
*H01L 31/113*   (2006.01)
*H01L 31/024*   (2014.01)
*H01L 31/02*    (2006.01)
*H01L 27/146*   (2006.01)

(52) U.S. Cl.
CPC ........ *H01L 31/024* (2013.01); *H01L 27/1469* (2013.01); *H01L 27/14634* (2013.01); *H01L 27/14636* (2013.01); *H01L 27/14645* (2013.01); *H01L 27/14689* (2013.01); *H01L 31/02019* (2013.01); *H01L 27/14618* (2013.01); *H01L 2224/45144* (2013.01); *H01L 2224/48091* (2013.01); *H01L 2224/48465* (2013.01); *H01L 2224/73265* (2013.01)

(58) Field of Classification Search
CPC ......... H01L 27/14632; H01L 27/14683; H01L 2023/405; H01L 2023/4037; H01L 2023/4068
USPC ................................ 257/432, 291, 292, 459
See application file for complete search history.

(56) References Cited

U.S. PATENT DOCUMENTS 6,667,543 B1    12/2003  Chow et al.
2008/0203452 A1  8/2008  Moon et al.
(Continued)

*Primary Examiner* — Sonya D McCall Shepard
(74) *Attorney, Agent, or Firm* — Slater Matsil, LLP

(57) ABSTRACT

A system and method for blocking heat from reaching an image sensor in a three dimensional stack with a semiconductor device. In an embodiment a heat sink is formed in a back end of line process either on the semiconductor device or else on the image sensor itself when the image sensor is in a backside illuminated configuration. The heat sink may be a grid in either a single layer or in two layers, a zig-zag pattern, or in an interleaved fingers configuration.

20 Claims, 7 Drawing Sheets

(56) References Cited

U.S. PATENT DOCUMENTS

2010/0141815 A1\* 6/2010 Yoshihara ......... H01L 27/14618
                                                                       348/294
2011/0089517 A1    4/2011 Venezia et al.
2013/0105928 A1    5/2013 Costello et al.

\* cited by examiner

IMAGE SENSOR DEVICE AND METHOD

This application is a continuation of U.S. patent application Ser. No. 14/880,720, filed on Oct. 12, 2015, and entitled, "Image Sensor Device and Method," which is a continuation of U.S. patent application Ser. No. 13/929,661, filed on Jun. 27, 2013, and entitled, "Image Sensor Device and Method," now U.S. Pat. No. 9,159,852, issued on Oct. 13, 2015, which claims priority to U.S. Provisional Application No. 61/791,989, filed on Mar. 15, 2013, and entitled "Image Sensor Device and Method," which applications are incorporated herein by reference.

BACKGROUND

Complementary metal oxide semiconductor image sensors generally utilize a series of photodiodes formed within an array of pixel regions of a semiconductor substrate in order to sense when light has impacted the photodiode. Adjacent to each of the photodiodes within each of the pixel regions a transfer transistor may be formed in order to transfer the signal generated by the sensed light within the photodiode at a desired time. Such photodiodes and transfer transistors allow for an image to be captured at a desired time by operating the transfer transistor at the desired time.

The complementary metal oxide semiconductor image sensors may generally be formed in either a front side illumination configuration or a back-side illumination configuration. In a front-side illumination configuration light passes to the photodiode from the "front" side of the image sensor where the transfer transistor has been formed. However, in this configuration the light is forced to pass through metal layers, dielectric layers, and past the transfer transistor before it reaches the photodiode. This may generate processing and/or operational issues as the metal layers, dielectric layers, and the transfer transistor may not necessarily be transparent and may block the light as it is trying to reach the photodiode.

In a back-side illumination configuration, the transfer transistor, the metal layers, and the dielectric layers are formed on the front side of the substrate, and light is allowed to pass to the photodiode from the "back" side of the substrate such that the light hits the photodiode before it reaches the transfer transistor, the dielectric layers, or the metal layers. Such a configuration may reduce the complexity of the manufacturing of the image sensor and its operation.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments are discussed in detail below. It should be appreciated, however, that the embodiments provide many applicable concepts that can be embodied in a wide variety of specific contexts. The specific embodiments discussed are merely illustrative of specific ways to make and use the embodiments, and do not limit the scope of the embodiments.

Embodiments will be described with respect to a specific context, namely a complementary metal oxide semiconductor (CMOS) back side illuminated image sensor in a three-dimensional stack. Other embodiments may also be applied, however, to other image sensors and other semiconductor devices in different packages.

Figure 1:
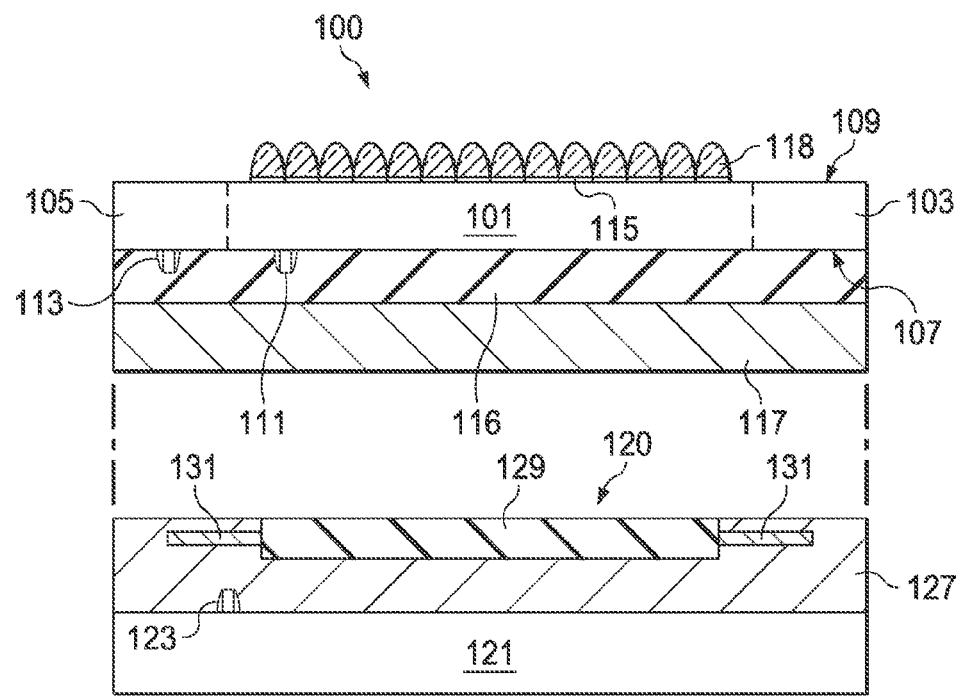
FIG. 1 illustrates an image sensor and an ASIC device in accordance with an embodiment.

With reference now to FIG. 1, there is shown an image sensor 100 which comprises a grid or array of backside illuminated pixels in a pixel region 101. The backside illuminated pixels will receive light that has impacted upon the backside of the image sensor 100 and translate that light into an electrical impulse. In an embodiment the backside illuminated pixels comprise a photosensitive diode along with, e.g., a transfer transistor, in order to receive light and transmit an electrical signal.

The image sensor 100 also may comprise a logic region 103 located adjacent to the pixel region 101. The logic region 103 may have additional circuitry and contacts for input and output connections to and from the pixel region 101. The logic region 103 is utilized to provide an operating environment for the pixel region 101 and to moderate communications between the array of pixel region 101 and other external devices such as a semiconductor device 120 (described further below).

The pixel region 101 and the logic region 103 may be formed in a first substrate 105. The first substrate 105 may comprise a front side 107 and a back side 109 and may be a semiconductor material such as silicon, germanium, diamond, or the like, with a crystal orientation of (110). Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, with other crystal orientations, may also be used. Additionally, the first substrate 105 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The first substrate 105 may be doped with a p-type dopant, such as boron, gallium, although the substrate may alternatively be doped with an n-type dopant, as is known in the art.

Photosensitive diodes (not individually illustrated) may be formed in the pixel region 101. The photosensitive diodes may be utilized to generate a signal related to the intensity or brightness of light that impinges on the photosensitive diodes. In an embodiment the photosensitive diodes may comprise n-type doped regions formed in the first substrate 105 (which in this embodiment may be a p-type substrate) and also may comprise heavily doped p-type doped regions formed on the surface of the n-type doped regions to form a p-n-p junction.

The n-type doped regions may be formed, e.g., using a photolithographic masking and implantation process. For example, a first photoresist (not shown in FIG. 1) may be placed on the first substrate 105. The first photoresist, may comprise a conventional photoresist material, such as a deep ultra-violet (DUV) photoresist, and may be deposited on the surface of the first substrate 105, for example, by using a spin-on process to place the first photoresist. However, any other suitable material or method of forming or placing the first photoresist may alternatively be utilized. Once the first photoresist has been placed on the first substrate 105, the first photoresist may be exposed to energy, e.g. light, through a patterned reticle in order to induce a reaction in those portions of the first photoresist exposed to the energy. The first photoresist may then be developed, and portions of the first photoresist may be removed, exposing a portion of the first substrate 105 where the photosensitive diodes are desired to be located.

Once the first photoresist has been placed and developed, the heavily doped n-type doped regions may be formed by implanting n-type dopants (e.g., phosphorous, arsenic, antimony, or the like) through the first photoresist. In an embodiment the n-type doped regions may be implanted such that their concentration of between about 1e15 atom/$cm^3$ and about 1e20 atom/$cm^3$, such as about 8e15 atom/$cm^3$. However, any suitable alternative concentration for the heavily doped n-type doped regions may alternatively be utilized.

After the n-type doped regions have been formed (e.g., through the implantation process), the p-type doped regions may be formed using, e.g., an ion implantation process using the first photoresist as a mask. The p-type doped regions may be formed to extend into the first substrate 105 between about 1 μm and about 4 μm. Additionally, the p-type doped regions may be formed to have a concentration of between about 1e15 atom/$cm^3$ and about 5e19 atom/$cm^3$, such as about 1e16 atom/$cm^3$.

Once the photosensitive diodes have been formed, the first photoresist may be removed. In an embodiment, the first photoresist may be removed using a process such as ashing. In such an embodiment a temperature of the first photoresist may be increased until the first photoresist undergoes a thermal decomposition, at which point the first photoresist may be removed. However, any other suitable removal process may alternatively be utilized to remove the first photoresist.

Further, as one of ordinary skill in the art will recognize, the photosensitive diodes described above are merely one type of photosensitive diodes that may be used in the embodiments. Any suitable photodiode may be utilized with the embodiments, and all of these photodiodes are intended to be included within the scope of the embodiments. Additionally, the precise methods or order of steps described above may be modified, such as by forming the p-type doped regions prior to the formation of the n-type doped regions, while still remaining within the scope of the embodiments.

A first transistor 111 may be formed in the pixel region 101 and a second transistor 113 may be formed in the logic region 103. In an embodiment the first transistor 111 may be a transfer transistor. However, the first transistor 111 is also merely representative of the many types of functional transistors that may be utilized within the pixel region 101. For example, while the first transistor 111 in FIG. 1 may be, e.g., a transfer transistor, embodiments may additionally include other transistors located within the pixel region 101, such as reset transistors, source follower transistors, or select transistors. These transistors may be arranged, for example, to form a four transistor CMOS image sensor (CIS). All suitable transistors and configurations that may be utilized in an image sensor are fully intended to be included within the scope of the embodiments. Similarly, while the second transistor 113 is illustrated in FIG. 1 as a logic transistor, it is also merely representative of the many types of active and passive devices that may be formed in the logic region 103 in order to provide the suitable connectivity to and from the pixel region 101.

The first transistor 111 and the second transistor 113 may comprise gate stacks that may be formed over the first substrate 105. The gate stacks may each comprise a gate dielectric and a gate electrode. The gate dielectrics and gate electrodes may be formed and patterned on the first substrate 105 by any suitable process known in the art. The gate dielectrics may be a high-K dielectric material, such as silicon oxide, silicon oxynitride, silicon nitride, an oxide, a nitrogen-containing oxide, aluminum oxide, lanthanum oxide, hafnium oxide, zirconium oxide, hafnium oxynitride, a combination thereof, or the like. The gate dielectrics may have a relative permittivity value greater than about 4.

In an embodiment in which the gate dielectrics comprise an oxide layer, the gate dielectrics may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In one embodiment, the gate dielectrics may be between about 10 Å to about 150 Å in thickness, such as 100 Å in thickness.

The gate electrodes may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In one example, amorphous silicon is deposited and recrystallized to create poly-crystalline silicon (poly-silicon). In an embodiment in which the gate electrodes is poly-silicon, the gate electrodes may be formed by depositing doped or undoped poly-silicon by low-pressure chemical vapor deposition (LPCVD) to a thickness in the range of about 100 Å to about 2,500 Å, such as 1,200 Å.

Spacers may be formed on the sidewalls of the gate dielectrics and the gate electrodes. The spacers may be formed by blanket depositing a spacer layer on the previously formed structure. The spacer layer may comprise SiN, oxynitride, SiC, SiON, oxide, and the like, and may be formed by commonly used methods such as chemical vapor deposition (CVD), plasma enhanced CVD, sputter, and other methods known in the art. The spacer layer is then patterned to form the spacers, such as by anisotropically etching to remove the spacer layer from the horizontal surfaces of the structure.

Source/drain regions may be formed in the first substrate 105 on an opposing side of the gate dielectrics from the photosensitive diodes and also on opposing sides of the gate stack of the second transistor 113. In an embodiment in which the first substrate 105 is a p-type substrate, the source/drain regions may be formed by implanting appropriate n-type dopants such as phosphorous, arsenic or antimony. The source/drain regions may be implanted using the gate electrodes and the spacers as masks to form lightly doped source/drain (LDD) regions and heavily doped source/drain regions.

It should be noted that one of ordinary skill in the art will realize that many other processes, steps, or the like may be used to form the source/drain regions and the photosensitive diodes. For example, one of ordinary skill in the art will realize that a plurality of implants may be performed using various combinations of spacers and liners to form the source/drain regions and the photosensitive diodes having a specific shape or characteristic suitable for a particular purpose. Any of these processes may be used to form the source/drain regions and the photosensitive diodes, and the above description is not meant to limit the embodiments to the steps presented above.

Once the first transistor 111 and the second transistor 113 have been formed, a first inter-layer dielectric (ILD) layer 116 may be formed over the pixel region 101 and contacts (not individually illustrated) may be formed through the first ILD layer 116. The first ILD layer 116 may comprise a material such as boron phosphorous silicate glass (BPSG), although any suitable dielectrics may be used for either layer. The first ILD layer 116 may be formed using a process such as PECVD, although other processes, such as LPCVD, may alternatively be used. The first ILD layer 116 may be formed to a thickness of between about 100 Å and about 3,000 Å.

Contacts (not individually illustrate in FIG. 1) may be formed through the first ILD layer 116 with suitable photolithography and etching techniques. In an embodiment a first photoresist material is utilized to create a patterned mask to define contacts. Additional masks, such as a hardmask, may also be used. An etching process, such as an anisotropic or isotropic etch process, is performed to etch the first ILD layer 116.

Contacts may then be formed so as to contact the first substrate 105 and the gate electrodes. The contacts may comprise a barrier/adhesion layer (not individually shown in FIG. 1) to prevent diffusion and provide better adhesion for the contacts. In an embodiment, the barrier layer is formed of one or more layers of titanium, titanium nitride, tantalum, tantalum nitride, or the like. The barrier layer may be formed through chemical vapor deposition, although other techniques could alternatively be used. The barrier layer may be formed to a combined thickness of about 50 Å to about 500 Å.

The contacts may be formed of any suitable conductive material, such as a highly-conductive, low-resistive metal, elemental metal, transition metal, or the like. In an exemplary embodiment the contacts are formed of tungsten, although other materials, such as copper, could alternatively be utilized. In an embodiment in which the contacts are formed of tungsten, the contacts may be deposited by CVD techniques known in the art, although any method of formation could alternatively be used.

After the contacts are formed, further processing of the front side 107 of the first substrate 105 may be performed. This processing may comprise various back-end-of-line processing such as forming various conductive and dielectric layers in order to form interconnections between the individually formed devices to each other. These interconnections may be made through any suitable formation process (e.g., lithography with etching, damascene, dual damascene, or the like) and may be formed using suitable conductive materials such as aluminum alloys, copper alloys, or the like.

Further processing may be performed on the back side 109 of the first substrate 105 after the processing on the front side 107 of the first substrate 105. In an embodiment the thickness of the back side 109 of the first substrate 105 may be reduced, or thinned. Thinning reduces the distance that light travels through the back side 109 of the first substrate 105 before it reaches the photosensitive diodes. The thinning of the back side 109 of the first substrate 105 may be performed using a removal process such as chemical mechanical polishing (CMP). In a CMP process, a combination of etching materials and abrading materials are put into contact with the back side 109 of the first substrate 105 and a grinding pad (not shown) is used to grind away the back side 109 of the first substrate 105 until a desired thickness is achieved. However, any suitable process for thinning the back side 109 of the first substrate 105, such as etching or a combination of CMP and etching, may alternatively be used. The back side 109 of the first substrate 105 may be thinned so that the first substrate 105 has a thickness of between about 2 µm and about 2.3 µm.

Once thinned, color filters 115 may be formed on the back side 109 of the first substrate 105. The color filters 115 may comprise filters for one of the primary colors (e.g., red, green, blue) and may be positioned to filter the light that will impinge upon the photosensitive diodes. The color filters 115 may be part of an array pattern of color filters, with each color filter being located over a respective pixel within the pixel region 101. For example, the color filters 115 may be part of a Bayer RGB pattern, a Yotsuba CRGB pattern, or any other suitable pattern for the location of color filters 115 over the image sensor 100.

The color filters 115 may comprise a polymeric material or resin, such as a polymeric polymer, which includes colored pigments. In an embodiment in which a polymeric polymer is utilized to form the color filters 115, the color filters 115 may be formed over the pixel region 101 using a process such as spin coating to form a first blanket layer of the first polymeric polymer, although any other suitable method may alternatively be utilized.

Once the first blanket layer of the polymeric polymer has been formed, the first blanket layer may be patterned such that the color filters 115 are formed over the desired pixels in the pixel region 101. In an embodiment the first blanket layer may be patterned using a suitable photolithographic masking and etching process, wherein a photoresist is placed, exposed, and developed to cover the desired portions of the first blanket layer. Once the desired portions are protected, the exposed portions of the first blanket layer may be removed using, e.g., an anisotropic etch. This process may be repeated for each desired color to form an array of color filters 115.

Optionally, microlenses 118 may be formed over the color filters 115. The microlenses 118 may be used to focus impinging light more directly onto the photosensitive diodes. The microlenses 118 may be formed by first applying and patterning a positive type photoresist (not shown) over the color filters 115. Once formed, the patterned photoresist may then be baked to round the photoresist into the curved microlenses 118.

Also illustrated in FIG. 1 is a semiconductor device 120 that will be bonded to the image sensor 100. In an embodiment the semiconductor device 120 is an ASIC device such as an image signal processor (ISP) that connects to the image sensor 100 in order to provide power and ground to the image sensor 100. The semiconductor device 120 also receives and/or sends signals to and from the image sensor 100, processes these signals, and may route the signals to external devices.

In an embodiment the semiconductor device 120 includes a second substrate 121 with active devices 123, metallization layers 127 and a heat sink 129. The second substrate 121 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

Active devices 123 may be formed on the second substrate 121. As one of ordinary skill in the art will recognize, a wide variety of active devices such as capacitors, resistors, inductors and the like may be used to generate the desired structural and functional requirements of the design for the semiconductor device 120. The active devices 123 may be formed using any suitable methods either within or else on the surface of the second substrate 121.

The metallization layers 127 are formed over the second substrate 121 and the active devices 123 and are designed to connect the various active devices 123 to form functional circuitry. While illustrated in FIG. 1 as a single layer, the metallization layers 127 may be formed of alternating layers of dielectric (e.g., low-k dielectric material) and conductive material (e.g., copper) and may be formed through any suitable process (such as deposition, damascene, dual damascene, etc.). In an embodiment there may be four layers of metallization separated from the second substrate 121 by at least one interlayer dielectric layer (ILD), but the precise number of metallization layers 127 is dependent upon the design of the semiconductor device 120.

The heat sink 129 is formed within the metallization layers 127. In an embodiment the heat sink 129 may act as a heat block and prevent heat generated from the semiconductor device 120 (e.g., the active devices 123 on the second substrate 121) from reaching the image sensor 100 and distorting or otherwise interfering with the image sensor 100. For example, if excess heat is allowed to reach the photodiodes within the image sensor 100, the image quality or uniformity of images taken by the image sensor 100 may be impacted. In particular examples, an improper heat distribution that could lead to a non-uniform image, and extra heat in the 3D stack of the image sensor 100 and the semiconductor device 120 could worsen dark current/white pixel issues. In other words, improper heat distribution may cause a brighter image to occur at some parts of the image sensor 100 due to a higher temperature.

As such, the heat sink 129 may be formed as a way of blocking and rerouting the heat generated by the active devices 123. By placing the heat sink 129 between, e.g., the active devices 123 and the image sensor 100, the heat sink 129 routes generated heat away from the image sensor 100. In an embodiment the heat sink 129 may be formed as an additional metallization layer within the metallization layers 127 to ensure that it is located between the active devices 123 and the image sensor 100, with the heat sink 129 shaped and formed to capture and reroute heat away from the image sensor 100.

Additionally, while illustrated in FIG. 1 as being within the upper most layer of the metallization layers 127, the embodiments are not limited to this position. Rather, the heat sink 129 may be formed in any suitable metallization layer or combination of metallization layers within the metallization layers 127. For example, the heat sink 129 may be formed in a lower metallization layer while additional conductive and insulative layers are formed on top of the heat sink 129. In such an embodiment connections and contacts (not individually illustrated) may be routed through the heat sink 129 to electrically interconnect the various layers.

Alternatively, instead of forming an additional layer specifically for the heat sink 129, which would add to the volume of the semiconductor device 120, the heat sink 129 may be formed into an already existing metallization layer such as by redesigning one of the existing metallization layers to include the structure of the heat sink 129. In such an embodiment the metallization layer may be redesigned to provide the desired thermal routing in addition to the electrical routing without the need for an additional layer to be added to the semiconductor device 120.

The heat sink 129 may be formed from thermally conductive material such as a metal and may be made using similar processes as the formation and patterning of the metallization layers 127. Such processes may include deposition processes, plating processes (such as electroplating or electroless plating processes), photolithographic masking and etching processes, combinations of these or the like. Particular processes may include damascene processes and dual damascene processes. In a particular embodiment the heat sink 129 is formed from the same materials as the conductive material within the metallization layers 127, and may be made using the same processes and at the same time as the metallization layers 127. As such, the inclusion of the heat sink 129 is compatible with back-end-of-line technologies.

In a particular embodiment the heat sink 129 may comprise a metal such as copper and may be formed using a damascene method of processing. For example, a dielectric material may be initially deposited over an underlying layer using, e.g., a chemical vapor deposition process. Once in place, a second photoresist (not individually illustrated) may be placed, illuminated, and developed in order to expose portions of the dielectric material in those locations where the heat sink 129 is desired. Once exposed, the dielectric material may be removed using, e.g., an etching process to form an opening in the dielectric material. After the etching process, the second photoresist may be removed using, e.g., a thermal process such as ashing.

After the second photoresist has been removed, the heat sink 129 may be formed using a first seed layer (not individually illustrated) and a plating process, such as electrochemical plating, although other processes of formation, such as sputtering, evaporation, or PECVD, may alternatively be used depending upon the desired materials. The heat sink 129 may comprise copper, but other thermally conductive materials, such as aluminum or tungsten, may alternatively be used. Once the openings in the dielectric material have been filled with conductive material, any excess conductive material outside of the openings in the dielectric material may be removed, and the heat sink 129 may be planarized with the dielectric material using, for example, a chemical mechanical polishing process.

Formed along with the heat sink 129 in a same layer as the heat sink 129 are horizontal portions of thermal vias 131 that connect to the heat sink 129 and allow for the desired routing of the heat away from the heat sink 129 (as discussed further below with respect to FIG. 3). In an embodiment the horizontal portions of thermal vias 131 may be formed either in the same process as the heat sink 129 or else, if desired, separated processes such as dual damascene or other deposition and patterning processes may be used to form the horizontal portions of the thermal vias 131.

Figure 2A:
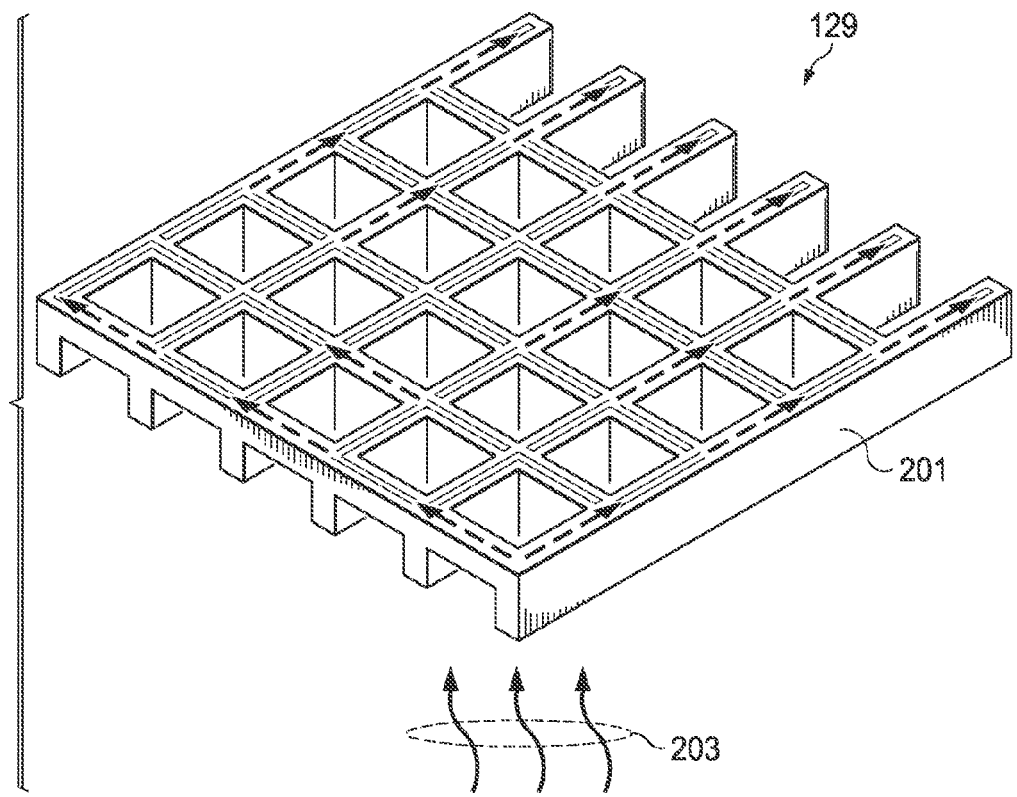
FIGS. 2A-2D illustrate embodiments of a heat sink in accordance with an embodiment.

FIGS. 2A-2D illustrate various embodiments of the heat sink 129. FIG. 2A illustrates a single layer grid pattern heat sink in which a grid 201 of conductive material is formed in a single layer of the metallization layers 127. The metal routing with the grid 201 of the heat sink 129 helps to reduce the process complexity by using a wide area metal to help block heat while simultaneously providing a uniform heat distribution. FIG. 2A additionally illustrates a path of heat transfer 203 from the semiconductor device 120 to the heat sink 129 and then through the heat sink 129 (illustrated using the arrows labeled 203 in FIG. 2A).

Figure 2B:
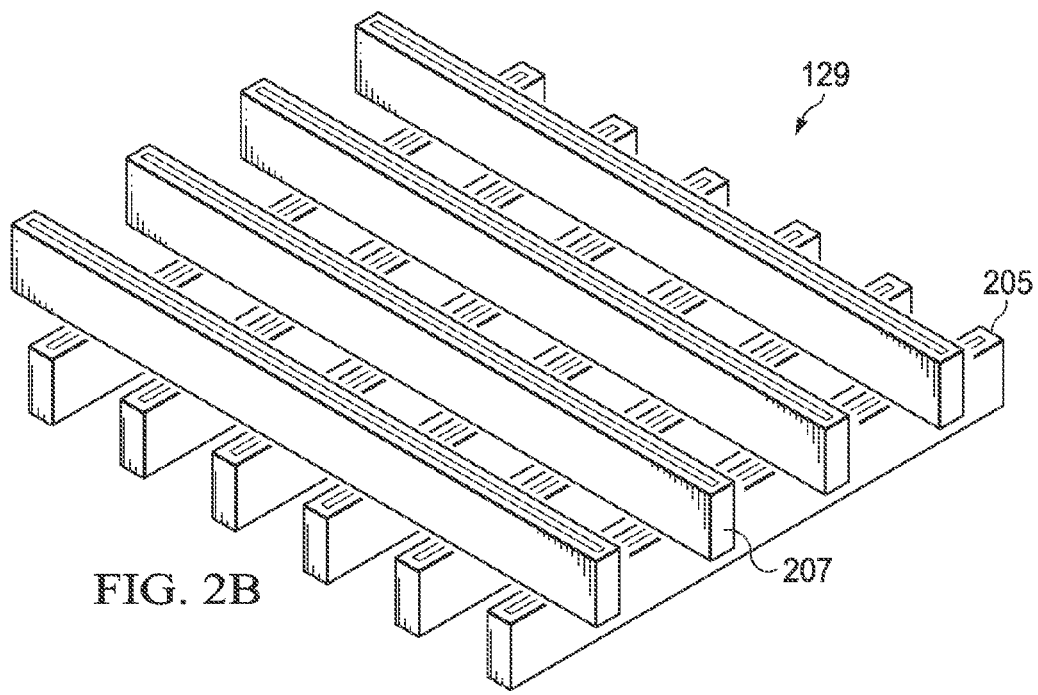

FIG. 2B illustrates a two layer grid pattern heat sink in which a first layer 205 of straight, parallel lines of the heat sink 129 is formed in a first layer of the metallization layers 127. Additionally in this embodiment, a second layer 207 of straight, parallel lines of the heat sink 129 is formed in a second layer of the metallization layers 127 over the first layer 205. By utilizing a multi-layer design for the heat sink 129, the heat sink 129 in this embodiment enhances thermal dissipation and heat blocking from the semiconductor device 120 by utilizing the second layer 207 to capture any residual heat that may pass through the first layer 205 of the heat sink 129.

Figure 2C:
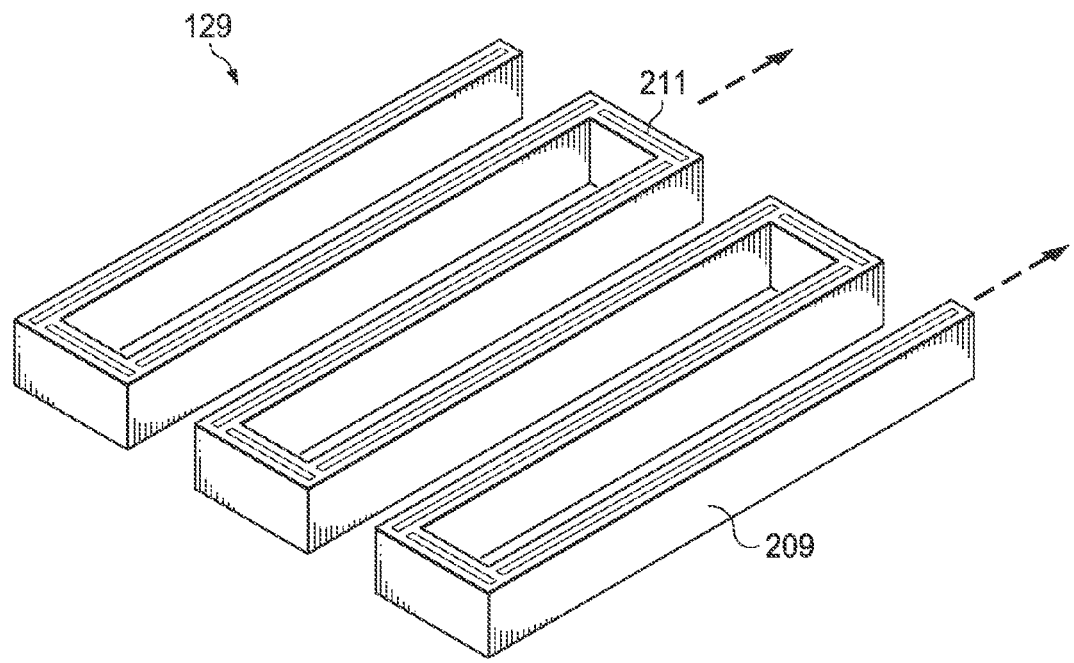

FIG. 2C illustrates another embodiment of a pattern for the heat sink 129. In this embodiment the heat sink 129 is arranged in a single layer and has a zigzag pattern. For example, the heat sink 129 in this embodiment has a series of parallel lines 209 that are connected to each other by cross-pieces 211 that alternate between one side of the heat sink 129 and the other side of the heat sink 129 to form a pattern that criss-crosses while allowing for the flow of heat through the heat sink 129.

Figure 2D:
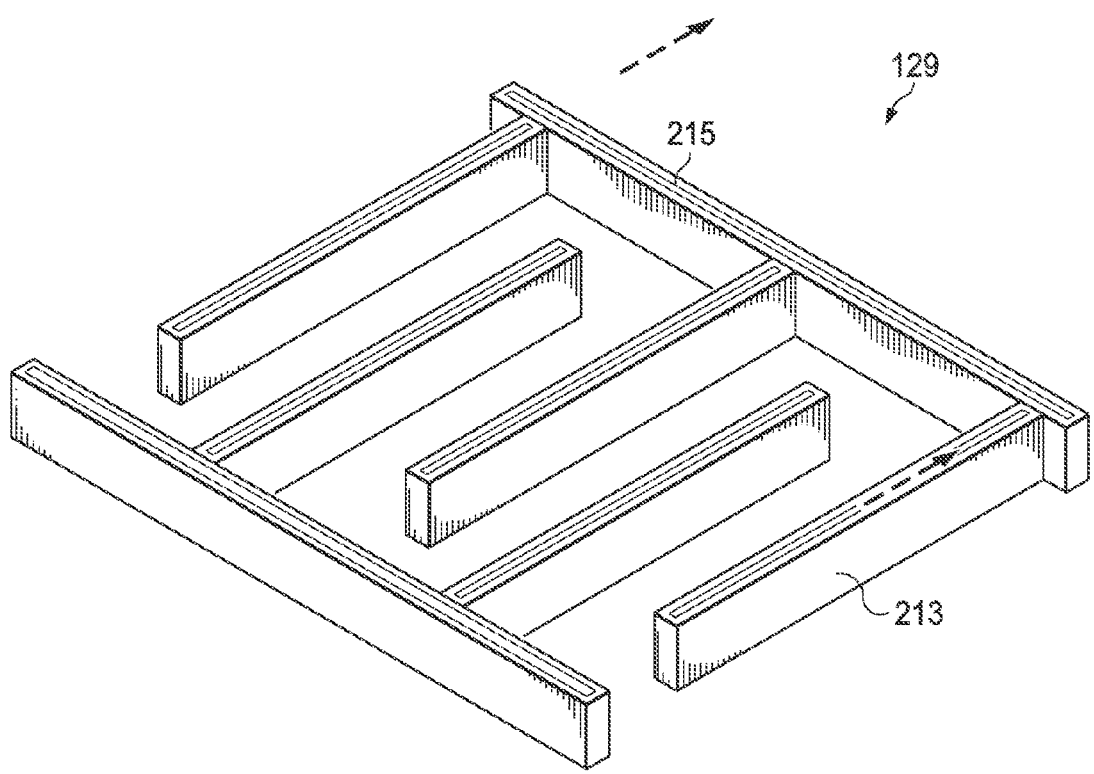

FIG. 2D illustrates yet another embodiment of a pattern for the heat sink 129. In this embodiment the heat sink 129 has multiple fingers 213 offset from each other. Every other finger is connected by a perpendicular line 215, such that the combination of the multiple fingers and perpendicular lines 215 form a set of interleaved fingers. By utilizing two sets of fingers, multiple thermally conductive pathways may be formed to enhance the ability of the heat to be removed before reaching the image sensor 100.

Figure 3:
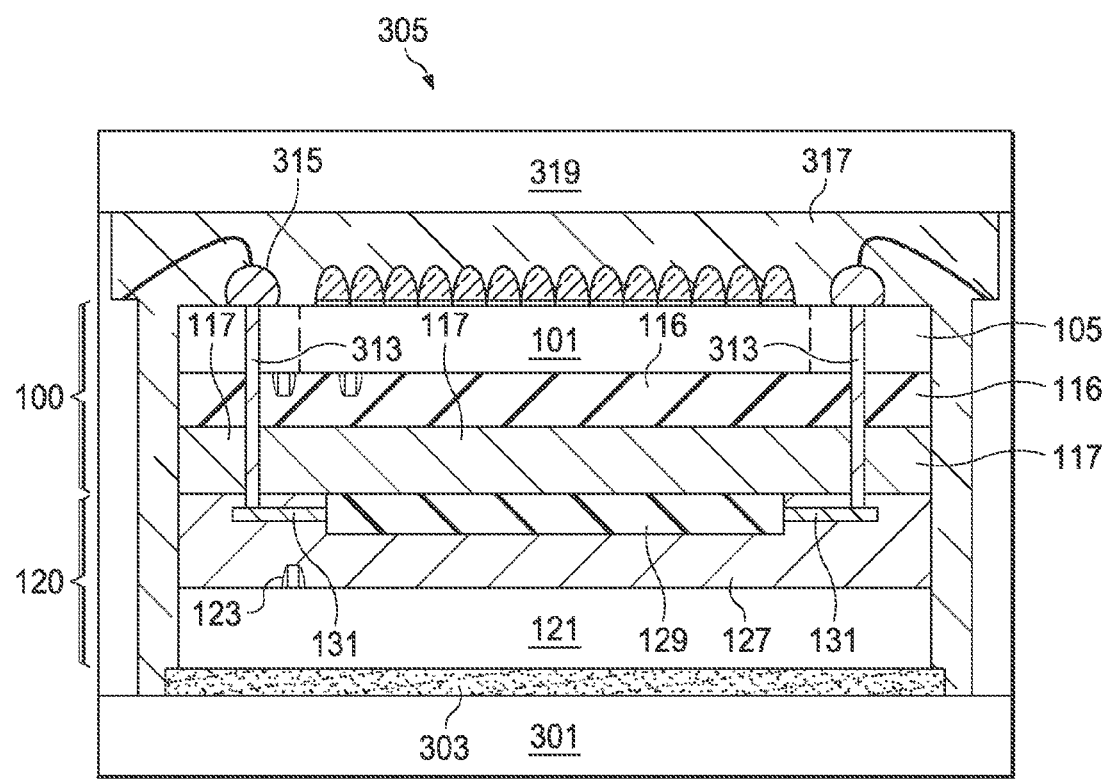
FIG. 3 illustrates a bonding of the image sensor and the ASIC device in a package in accordance with an embodiment.

FIG. 3 illustrates a bonding of the image sensor 100 and the semiconductor device 120. In an embodiment the image sensor 100 and the semiconductor device 120 may be bonded to each other using any suitable bonding technique, such as by oxide fusion bonding, silicon-on-glass bonding or the like. In an embodiment the fusion bonding may be performed by initially forming an oxide layer on either one or both of the image sensor 100 or the semiconductor device 120. The oxide layer may be formed by a deposition process or, if the materials of the image sensor 100 and semiconductor device 120 are suitable, exposing the surfaces of the image sensor 100 and semiconductor device 120 to a oxidizing environment. Once formed, the image sensor 100 is then aligned with the second substrate 121 and the two are contacted together to initiate a bonding of the image sensor 100 with the second substrate 121.

Once the bonding has been initiated by contacting the image sensor 100 to the second substrate 121, the bonding process may be continued to strengthen the bonding by heating the image sensor 100 and the second substrate 121. In an embodiment this heating may be performed by annealing the image sensor 100 and the second substrate 121 at a temperature of between about 150° C. and about 800° C. in order to strengthen the bond. However, any suitable method, including allowing the image sensor 100 and the second substrate 121 to bond at room temperature, may alternatively be used, and all such bonding is fully intended to be included within the scope of the embodiments.

Alternatively, a wet cleaning procedure may be utilized to initiate the fusion bond between the image sensor 100 and the second substrate 121. For example, in an embodiment in which the image sensor 100 is silicon, the image sensor 100 may be bonded by initially cleaning the image sensor 100 using, e.g., a wet cleaning procedure such as an SC-1 or SC-2 cleaning procedure to form a hydrophilic surface. The image sensor 100 is then aligned with the second substrate 121 and the two are contacted together to begin the bonding procedure. Once the image sensor 100 has contacted the second substrate 121, the thermal anneal may be utilized to strengthen the bond.

In yet another embodiment, the image sensor 100 may be bonded by first treating the image sensor 100 to form a hydrophobic surface. For example, in an embodiment the image sensor 100 may etched using an etching solution of hydrogen fluoride (HF) or ammonium fluoride ($NH_4F$). Once treated, the image sensor 100 is then aligned with the second substrate 121 and placed in contact. The contacted image sensor 100 and second substrate 121 are then annealed to strengthen the bond.

However, the descriptions of the fusion bonding using a oxide layer, a cleaning process, or an etching solution as described above are merely examples of types of process that may be utilized in order to bond the image sensor 100 to the second substrate 121, and are not intended to be limiting upon the embodiments. Rather, any suitable bonding process may alternatively be utilized to bond the image sensor 100 to the second substrate 121, and all such processes are fully intended to be included within the embodiments.

FIG. 3 also illustrates the placing of the bonded image sensor 100 and the semiconductor device 120 into a ceramic leadless chip carrier (CLCC) 305. In this embodiment the semiconductor device 120 is attached to a printed circuit board 301 using, e.g., an adhesion layer 303. The adhesion layer 303 may comprise an adhesive material such as, e.g., a glue, an epoxy, a polymer, combinations of these, or the like, and may be applied by initially applying an amount of the adhesive material to the printed circuit board 301, placing the semiconductor device 120 in contact with the adhesion layer 303, and then curing the adhesion layer 303 in order to solidify the connection between the printed circuit board 301 and the semiconductor device 120.

In this embodiment vertical portions of thermal vias 313 may be formed through the image sensor 100 to the heat sink 129. These thermal vias 313 may be, e.g., through substrate vias (TSVs) that connect to the horizontal portions of the thermal vias 131 to form a path through the image sensor 100 and the semiconductor device 120 to the heat sink 129. As such, the heat sink 129, the horizontal portions of the thermal vias 131, and the vertical portions of the thermal vias 313, form a thermal pathway that removes heat from the semiconductor device 120 and routes heat away from the image sensor 100. By removing the heat from the semiconductor device 120, the heat is removed before the heat can affect the image sensor 100 and interfere with the operation of the image sensor 100. As such, the heat sink 129 can make the overall packaged device comprising the image sensor 100 and the semiconductor device 120 more efficient.

In an embodiment the vertical portions of the thermal vias 313 may be formed after the image sensor 100 and the semiconductor device 120 have been bonded. For example, the vertical portions of the thermal vias 313 may be formed using, e.g., a deep via type of technology to etch through the image sensor 100 and the semiconductor device 120 to the horizontal portion of the thermal via 131. Once the opening has been formed, the opening may be filled with a conductive material such as copper using, e.g., a seed layer followed by an electroplating process, although any suitable process may alternatively be formed. Excess material outside of the opening may then be removed.

Alternatively, the formation of the vertical portion of the thermal via 313 may be incorporated into the formation processes of the image sensor 100 and the semiconductor device 120. For example, the vertical portion of the thermal via 313 may be formed within each of the individual layers (e.g., the first ILD layer 116, the metallization layers 127, etc.) as these layers are being formed. Once these layers with the connecting portions of the vertical portion of the thermal vias 313 have been formed, the image sensor 100 may be bonded to the semiconductor device 120 such that the individual portions of the vertical portion of the thermal vias 313 are aligned with each other to provide a pathway from the heat sink 129 through the image sensor 100.

However, while two processes for forming the vertical portions of the thermal vias 313 are described above, these processes are intended to be illustrative only and are not intended to be limiting upon the embodiments. Rather, any suitable processes or combination of processes may alternatively be used to form the horizontal portions of the thermal vias 131 and the vertical portions of the thermal vias 313 and connect the horizontal portions of the thermal vias 131 and the vertical portions of the thermal vias 313. All such processes are fully intended to be included within the scope of the embodiments.

Once the horizontal portions of the thermal vias 131 and the vertical portions of the thermal vias 313 have been formed through the semiconductor device 120 and the image sensor 100, an external connector 315, such as a wire bond may be used to connect the vertical portions of the thermal vias 313 to the CLCC package 305. In an embodiment in which the external connector 315 is a wire bond, an electronic flame off (EFO) wand may be used to raise the temperature of a gold wire (not individually illustrated in FIG. 3) within a capillary controlled by a wire clamp (also not individually illustrated in FIG. 3). Once the temperature of the gold wire is raised to between about 150° C. and about 250° C., the gold wire is contacted to the image sensor 100 to form a first contact and then the gold wire is moved to a lead in the CLCC package 305 (also not individually illustrated in FIG. 3) to form a second contact. Once connected, the remainder of the gold wire is separated from the connected portions to form the external connector 315.

However, as one of ordinary skill in the art will recognize, the wire bond embodiment for the external connectors 315 described above is not the only type of electrical and physical connections that may be made between the image sensor 100 and the CLCC package 305. Rather, any other suitable connection between the vertical portions of the thermal vias 313 and the CLCC package 305 may alternatively be utilized, and all such connections are fully intended to be included within the scope of the embodiments.

Additionally, the CLCC package 305 may comprise glass 317 overlying the pixel region 101 of the image sensor 100 in order to provide protection to the image sensor 100 while also allowing light to pass through to the pixels within the pixel region 101. An optical cover 319 may be placed over the glass 317 and the image sensor 100 in order to seal the CLCC package 305 and provide protection to the image sensor 100 and the semiconductor device 120 from the external environment.

In this embodiment the heat sink, 129, the horizontal portions of the thermal vias 131, the vertical portions of the thermal vias 313, the external connector 315, and the CLCC package provide a thermal pathway for heat to travel around the photodiode within the image sensor 100. By routing heat along this path instead of into the pixel array of the image sensor, deviations in images caused by undesired heat may be minimized or eliminated, thereby making the overall device more efficient.

Figure 4:
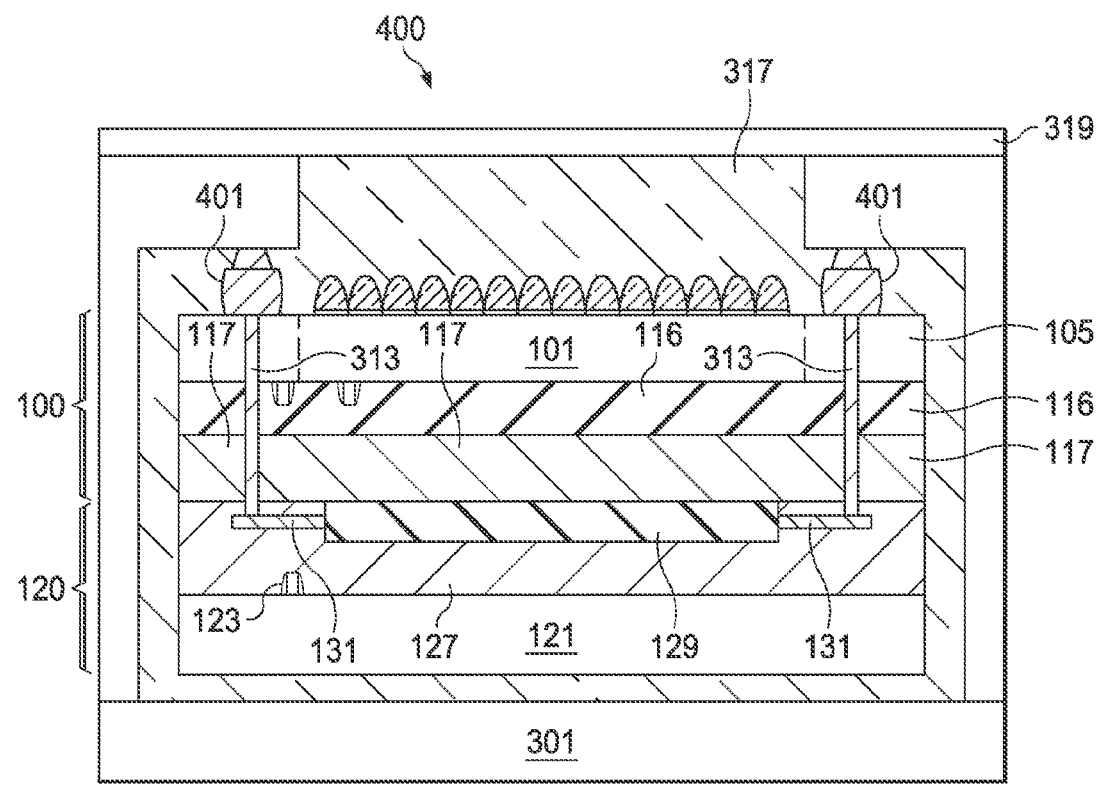
FIG. 4 illustrates another packaging of the image sensor and the ASIC device in accordance with an embodiment.

FIG. 4 illustrates another embodiment in which the bonded semiconductor device 120 and image sensor 100 are packaged within a flip chip package 400. In this embodiment, instead of physically attaching the semiconductor device 120 to the printed circuit board 301, the image sensor 100 is physically connected to the flip chip package 400 using, e.g., gold stud bumps (GSB) 401, although any other suitable method of attachment may alternatively be utilized. In an embodiment in which GSBs 401 are utilized, a non-conductive adhesive and underfill (not individually illustrated in FIG. 4) are placed on the flip chip package 400, and gold stud bumps are formed on the image sensor 100 in electrical contact with the vertical portions of the thermal vias 313. Once the GSBs 401 are formed and the image sensor 100 has been aligned with the flip chip package 400, pressure and heat are applied to crush the GSBs 401 and force them through the non-conductive adhesive and underfill to make contact with conductive traces (such as a copper nickel gold alloy trace, also not individually illustrated in FIG. 4) in the flip chip package 400.

Accordingly, the vertical portions of the thermal vias 313, instead of being connected to the external connectors 315, are in direct contact with the flip chip (GSB) package 400 itself. As such, the heat sink 129, the horizontal portions of the thermal vias 131, the vertical portions of the thermal vias 313 and the flip chip (GSB) package 400 itself provide a thermal path that removes heat from the semiconductor device 120 before the heat can interfere with the image sensor 100.

Figure 5:
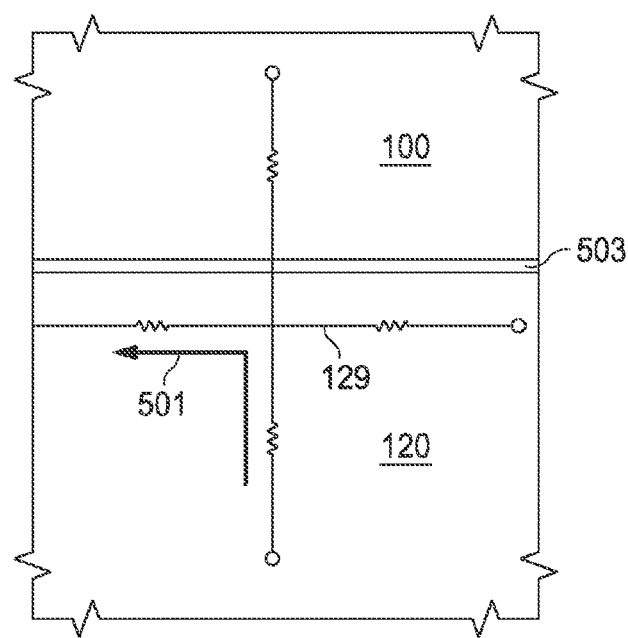
FIG. 5 illustrates a thermal resistance chart in accordance with an embodiment.

FIG. 5 illustrates a thermal path 501 of heat being directed around the image sensor 100. In the embodiment illustrated, the second substrate 121 of the semiconductor device 120 is silicon (with a thermal conductivity of 149 W/(m*K)), the heat sink 129 is formed of copper (with a thermal conductivity of 401 W/(m*K)), and the image sensor 100 and the semiconductor device 120 are bonded using a layer of silicon dioxide 503 (with a thermal conductivity of 1.2-1.4 (W/(m*K)), which may be about 1 μm in thickness. As such, heat generated by the semiconductor device 120, instead of flowing through the layer of silicon dioxide 503 of the bond with its low thermal conductivity, will instead flow primarily through the copper in the heat sink 129, which has a much higher thermal conductivity. By utilizing the differences in thermal conductivity, the heat may be channeled along the thermal path 501 in the heat sink 129 before it can significantly enter the image sensor 100 through the layer of silicon dioxide 503.

Figure 6:
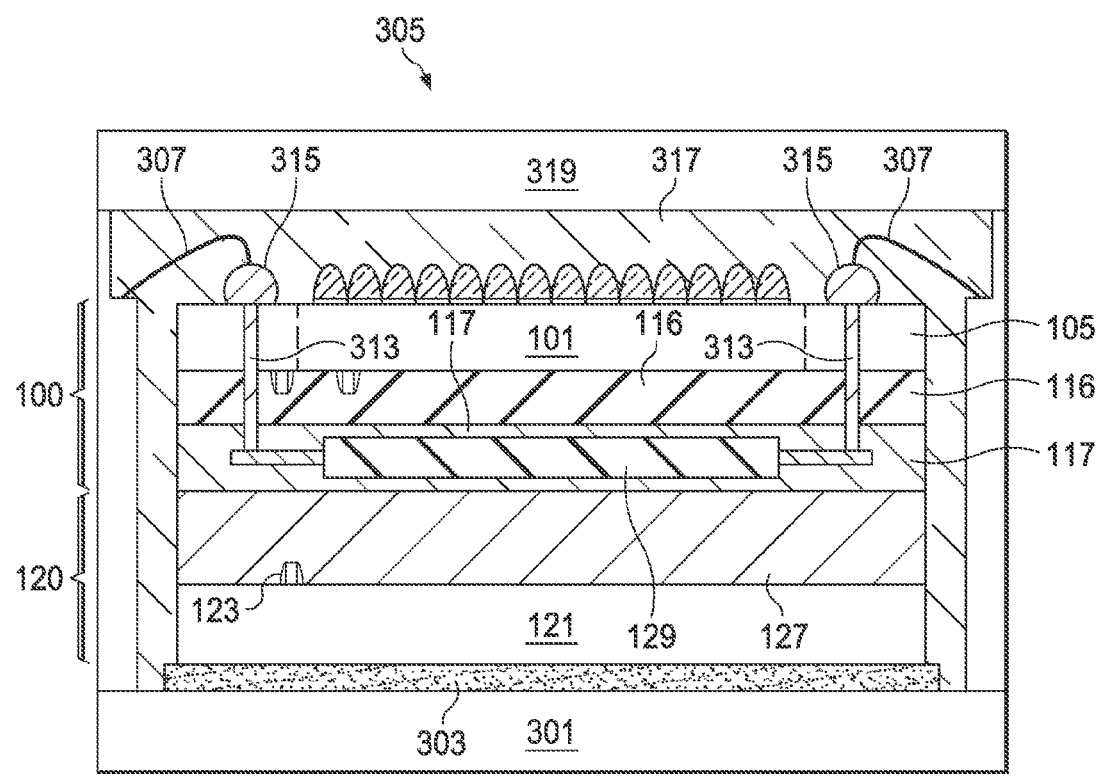
FIG. 6 illustrates an embodiment in which the heat sink is formed within an image sensor in accordance with an embodiment.

FIG. 6 illustrates another alternative embodiment in which the heat sink 129 is not formed within the semiconductor device 120. Rather, the heat sink 129 is formed in the metallization layers 117 of the image sensor 100. For example, the heat sink 129 may be formed as one or more of the layers during the back-end-of-line processing of the image sensor 100 and, once the image sensor 100 has been bonded to the semiconductor device 120, the heat sink 129 remains between the heat generation of the semiconductor device 120 and the pixel region 101 of the image sensor 100. In this embodiment the horizontal portions of the thermal vias 131 and the vertical portions of the thermal vias 313 (in either embodiment described above) may be formed to connect to the heat sink 129 in the image sensor 100 rather than being formed through the image sensor 100 and into the semiconductor device 120.

By forming the heat sink 129 between the active devices 123 and the pixel array of the image sensor, a uniform heat distribution below the image sensor 100 may be generated to avoid any partial bright or nonuniform image issues that may arise from non-uniform heat distribution. This helps to keep the image quality comparable to other back-side illuminated CMOS image sensors that may not use the semiconductor device 120.

Figure 7A:
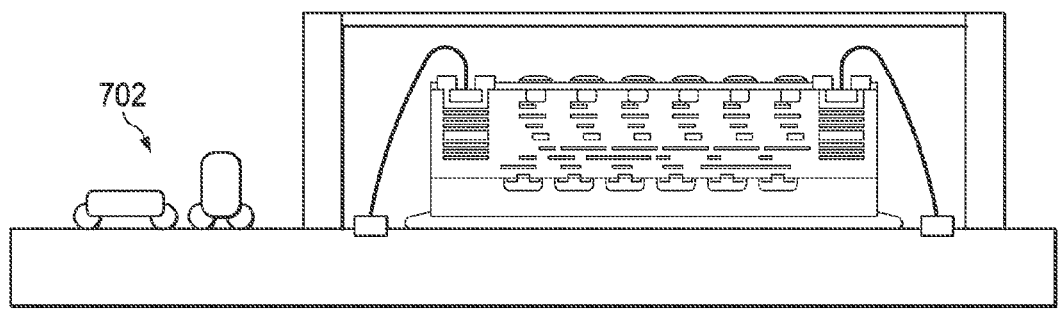
FIGS. 7A-7D illustrate other packages in which embodiments may be implemented.
Figure 7B:
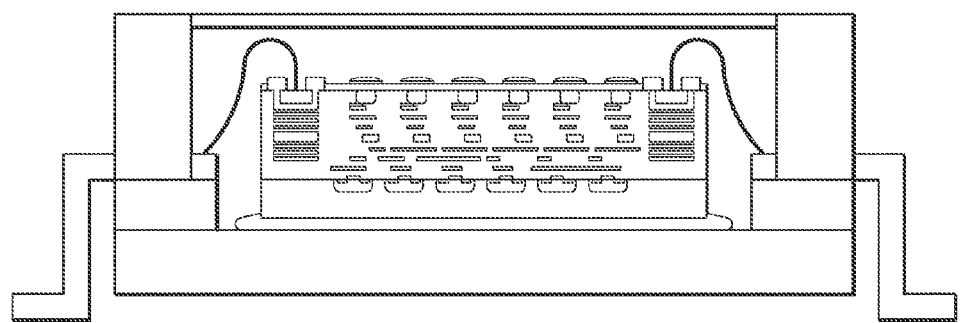
Figure 7C:
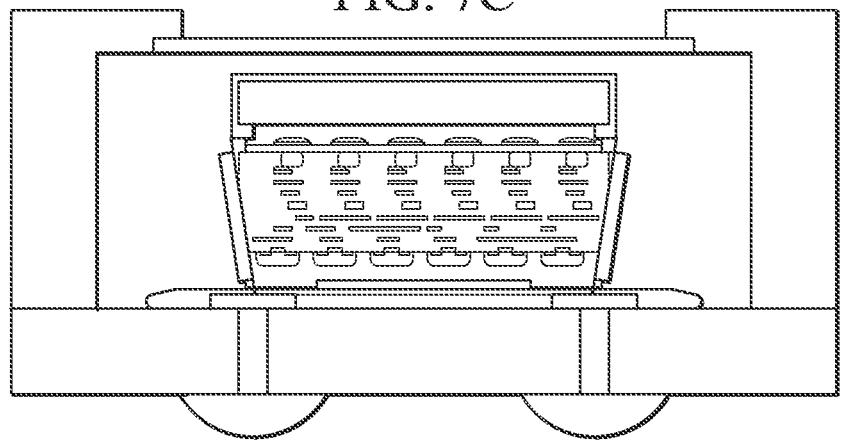
Figure 7D:
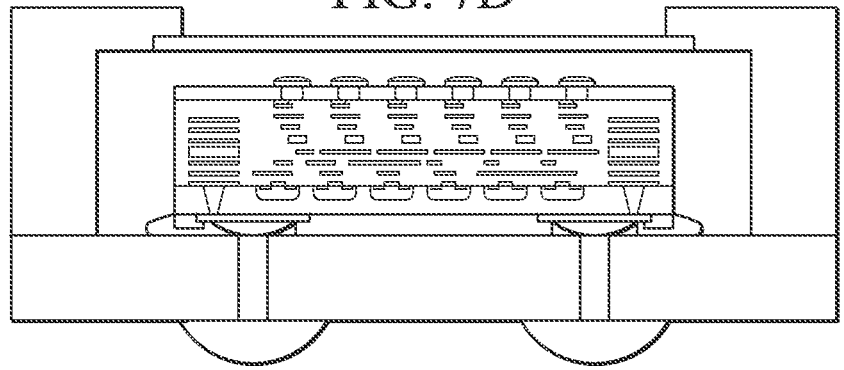

FIGS. 7A-7D illustrate other packages that may be utilized with the embodiments to provide a thermal pathway away from the image sensor 100. For example, FIG. 7A illustrates a reconstructed wafer (RW) chip on board (COB) package 701 which provides not only a package for the image sensor 100 but also passive components 702 that may be used with the image sensor 100. FIG. 7B illustrates a quad flat package (QFP) 703 with wire bonds, and FIG. 7C illustrates a chip scale package 705. Finally, FIG. 7D illustrates a through silicon via (TSV) type of package with controlled, collapse, chip connection (C4) connectors.

Additionally, in an embodiment in which a RW/COB package 701 is utilized, the process flow for a reconstructed wafer may involve an initial quality control followed by wafer taping, wafer grinding, wafer de-taping, wafer mounting, wafer sawing, and a first AVI inspection. Once the first AVI inspection has been performed, a UV irradiation may be performed, followed by a die sort, a deionized water cleaning, a second AVI inspection, a 100% visual inspection by 60× optical microscope, a quality assurance gate, a 100% AOI check, and another quality assurance gate before additional processing is performed. Such processing allows for a reconstructed wafer with 100% known good dies on it for further processing.

However, as one of ordinary skill in the art will recognize, the two packages described above with respect to FIGS. 3-4 are merely representative examples of packages into which embodiments may be utilized. Rather, any other suitable package technology may alternatively be utilized, and all such packages are fully intended to be included within the scope of the embodiments.

By utilizing the heat sink 129 along with the heat conduction path (e.g., the horizontal portions of the thermal vias 131 and the vertical portions of the thermal vias 313), the external connectors 315 (or the GSBs 401), and the package itself (e.g., the CLCC package 305, the overall heat dissipation of the full CIS chip can be reduced, which decreases the thermal budget in the chip. This allows for a more uniform heat distribution, which again lowers the thermal budget and allows for a better thermal dissipation. Such improvements allow for a more efficient image sensor and an overall better product.

In accordance with an embodiment, a semiconductor device comprising an image sensor comprising a pixel is provided. A semiconductor device is bonded to the image sensor, the semiconductor device comprising a substrate, and a heat sink is at least partially located in a first metallization layer between the pixel and the substrate.

In accordance with another embodiment, a semiconductor device comprising an image sensor, the image sensor comprising a first substrate and a first set of metallization layers adjacent to the first substrate is provided. A semiconductor device is bonded to the image sensor, the semiconductor device comprising active devices on a second substrate and a second set of metallization layers adjacent to the second substrate, the second set of metallization layers being different from the first set of metallization layers, the first set of metallization layers and the second set of metallization layers forming a third set of metallization layers between the first substrate and the second substrate. A heat sink is located at least partially in the third set of metallization layers and a package is surrounding the image sensor and the semiconductor device, the package in thermal connection with the heat sink.

In accordance with yet another embodiment, a method of manufacturing a semiconductor device comprising manufacturing a first semiconductor device is provided. The manufacturing the first semiconductor device comprises forming active devices on a first substrate and forming a plurality of metallization layers over the active devices, the plurality of metallization layers comprising a heat sink. The first semiconductor device is bonded to an image sensor with the heat sink between the active devices and the image sensor.

Although the present embodiments and their advantages have been described in detail, it should be understood that various changes, substitutions and alterations can be made herein without departing from the spirit and scope of the embodiments as defined by the appended claims. For example, charge coupled devices (CCD) may be utilized in place of the CMOS devices within the image sensor. These devices, steps and materials may be varied while remaining within the scope of the embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A semiconductor device comprising:
   a semiconductor die comprising:
      a heat block located over a semiconductor substrate; and
      a first metallization layer located such that the heat block is located between the first metallization layer and the semiconductor substrate, wherein connections between the first metallization layer and the semiconductor substrate are routed through the heat block; and
   a thermal via in thermal connection with the heat block, wherein the thermal via extends fully through a semiconductor substrate of an image sensor located on an opposite side of the first metallization layer than the heat block.

2. The semiconductor device of claim 1, further comprising a wire bond in thermal connection with the thermal via.

3. The semiconductor device of claim 1, further comprising gold stud bumps in thermal connection with the thermal via.

4. The semiconductor device of claim 3, wherein the gold stud bump is part of a flip chip package.

5. The semiconductor device of claim 1, wherein the image sensor is bonded to the semiconductor die through an oxide layer.

6. The semiconductor device of claim 1, further comprising a through silicon via package attached to the semiconductor die.

7. A semiconductor device comprising:
a backside image sensor;
a semiconductor die bonded to the backside image sensor, wherein the semiconductor die further comprises:
a semiconductor substrate; and
a heat sink located within at least two metallization layer between the semiconductor substrate and the backside image sensor, wherein the heat sink provides thermal routing and also provides electrical routing.

8. The semiconductor device of claim 7, wherein a first portion of the heat sink has a first longitudinal axis and a second portion of the heat sink has a second longitudinal axis perpendicular to the first longitudinal axis, the first portion being in a separate metallization layer from the second portion.

9. The semiconductor device of claim 8, further comprising a second metallization layer of the semiconductor die, wherein the at least one metallization layer is located between the semiconductor substrate and the second metallization layer.

10. The semiconductor device of claim 7, further comprising a chip scale package attached to the semiconductor die.

11. The semiconductor device of claim 7, further comprising a first thermal via in thermal connection with the heat sink, the first thermal via being located in the at least one metallization layer.

12. The semiconductor device of claim 11, wherein the heat sink comprises a first material and the first thermal via comprises the first material.

13. The semiconductor device of claim 11, further comprising a second thermal via in thermal connection with the first thermal via, the second thermal via intersecting the first thermal via at a right angle.

14. A semiconductor device comprising:
an image signal processor die, the image signal processor die further comprising:
a semiconductor substrate;
a heat sink located within a metallization layer over the semiconductor substrate; and
a first thermal via located fully within the metallization layer and thermally connected to the heat sink, the first thermal via having a first longitudinal axis;
an image sensor bonded to the image signal processor die; and
a second thermal via extending through the image sensor and into the image signal processor die, wherein the second thermal via is in thermal connection with the first thermal via and wherein the second thermal via has a second longitudinal axis perpendicular to the first longitudinal axis.

15. The semiconductor device of claim 14, further comprising a wire bond in connection with the second thermal via.

16. The semiconductor device of claim 14, further comprising a gold stud bump in connection with the second thermal via.

17. The semiconductor device of claim 14, further comprising a reconstructed wafer chip on board package surrounding the image sensor.

18. The semiconductor device of claim 17, further comprising passive components incorporated within the reconstructed wafer chip on board package.

19. The semiconductor device of claim 14, further comprising a quad flat package surrounding the image sensor.

20. The semiconductor device of claim 7, wherein the second thermal via extends fully through a semiconductor substrate of the backside image sensor.

* * * * *